(12) United States Patent
Vaufrey et al.

(10) Patent No.: US 7,851,814 B2
(45) Date of Patent: Dec. 14, 2010

(54) LIGHT-EMITTING DIODE, ONE OF THE ELECTRODES OF WHICH IS A MULTILAYER MADE OF AMORPHOUS CARBON

(75) Inventors: David Vaufrey, Rennes (FR); Benoit Racine, Voiron (FR); Christophe Fery, Rennes (FR)

(73) Assignee: Thomson Licensing, Boulogne Billancourt (FR)

( * ) Notice: Subject to any disclaimer, the term of this patent is extended or adjusted under 35 U.S.C. 154(b) by 0 days.

(21) Appl. No.: 11/472,971

(22) Filed: Jun. 22, 2006

(65) Prior Publication Data

US 2007/0029557 A1   Feb. 8, 2007

(30) Foreign Application Priority Data

Jun. 28, 2005   (FR)   ................................. 05 51796

(51) Int. Cl.
*H01L 33/00* (2010.01)
(52) U.S. Cl. .................... 257/98; 257/79; 257/E51.002; 257/E51.018; 257/E51.019; 257/E51.021; 257/E33.055; 257/E33.062; 257/E33.063
(58) Field of Classification Search .......... 257/E51.019, 257/E51.021, E51.002, E51.018, E51.022, 257/E33.062, E33.063, 79, 98, E33.055
See application file for complete search history.

(56) References Cited

U.S. PATENT DOCUMENTS

| | | | |
|---|---|---|---|
| 6,337,492 B1 * | 1/2002 | Jones et al. | 257/40 |
| 6,429,461 B1 * | 8/2002 | Tanaka et al. | 257/91 |
| 6,756,732 B1 * | 6/2004 | Kawase | 313/504 |
| 6,872,472 B2 * | 3/2005 | Liao et al. | 428/690 |
| 7,038,374 B2 * | 5/2006 | Yamazaki et al. | 313/506 |

FOREIGN PATENT DOCUMENTS

| | | | |
|---|---|---|---|
| JP | 2003-109774 | * | 4/2003 |
| WO | WO 03/052842 A2 | | 6/2003 |
| WO | WO 2005/048367 | * | 5/2005 |

OTHER PUBLICATIONS

Hajime et al., "Organic Electroluminescent Element and Its Manufacturing Method", Machine translation of Japanese Patent Application Publication JP 2003-109774.*
Machine translation of JP 2003-109774.*
N. Savvides, "Four-fold to three-fold transition . . . electrical properties", Journal of Applied Physics 58 (1985), pp. 518-521.*

(Continued)

*Primary Examiner*—Kenneth A Parker
*Assistant Examiner*—Jay C Kim
(74) *Attorney, Agent, or Firm*—Robert D. Shedd; Harvey D. Fried; Patricia Verlangieri

(57) ABSTRACT

Diode comprising a substrate and an organic electroluminescent layer interposed between a lower electrode and an upper electrode, at least one of which electrodes is formed from a multilayer which is itself formed by the stack of adjacent sublayers made of amorphous carbon, having different refractive indices $n_1$, $n_2$. The amorphous carbon contains no added silicon, thereby making it possible to avoid using silane for the manufacture. The multilayer provides an electrode function, a multimirror function and an encapsulation function.

5 Claims, 1 Drawing Sheet

OTHER PUBLICATIONS

Search Report Dated Jan. 24, 2006.
Patent Abstracts PI Japan vol. 2003, No. 08, Oct. 6, 2003 4 JP 2003 109774 A(Japan Science & Technology Corp.; Toppan Printing Co. Ltd.), Apr. 11, 2003 abstract figure 1.
Feoktistov N. A. et al.: "Multilayer Systems Based on A-SI:C:J Films as Dielectric and Conducting Optical Mirrors" Technical Physics Letters, Amercan Institute of Physics. New York, US, vol. 20. No. 3, Mar. 1, 1994, es 180-181, XP000448028.

Godet c et al.: "Structural and Electronic 1-6 properties of electron cyclotron resonance plasma deposited hydrogenated amorphous carbon and carbon nitride film" Journal of Applied Physics, American Institute of Physics, New York, U.S., vol. 91, No. 7, Apr. 1, 2002, pp. 4154-4162, XP012056083 ISSN: 0021-8979 Le Document En Entier.

\* cited by examiner

LIGHT-EMITTING DIODE, ONE OF THE ELECTRODES OF WHICH IS A MULTILAYER MADE OF AMORPHOUS CARBON

This application claims the benefit, under 35 U.S.C. 119, of French patent application no. 0551796 filed 28 Jun. 2005.

FIELD OF THE INVENTION

The invention relates to organic light-emitting diodes and to panels comprising an array of such diodes, especially for illumination or for image display.

DESCRIPTION OF THE PREFERRED EMBODIMENT

Document WO 03/052842 describes a light-emitting diode comprising a substrate, an organic electroluminescent layer that is interposed between a lower electrode in contact with the substrate and an upper electrode, and is capable of emitting radiation through at least one of said electrodes when a current is injected by these electrodes through the organic layer; according to that document, the diode also includes an encapsulation multilayer forming a mirror, which is interposed between the substrate and the lower electrode and/or is positioned above the upper electrode, which comprises at least one series formed from a sublayer of a material of a first type, having a first refractive index, and a sublayer of a material of a second type, having a second refractive index different from the first refractive index. According to that document, the sublayers of materials of different types are placed alternately one on top of another, having a suitable thickness for transmitting the radiation emitted by the organic electroluminescent layer and cooperate in order to form a barrier to the diffusion of oxygen and water vapour, so as to fulfil the encapsulation function.

It should be pointed out that the encapsulation function is important not only in the upper position, but also in the lower position, where it acts as a diffusion barrier to certain elements from the substrate into the organic electroluminescent layer.

The materials of the first type and/or those of the second type described in said document make the encapsulating multimirror layer electrically insulating. Consequently, one drawback of this type of diode structure is that it requires the deposition of an electrode between the encapsulating multimirror layer and the organic electroluminescent layer, thereby complicating the process for fabricating the diode, especially when this encapsulating multimirror layer is in the lower position, as it is generally recommended to provide, in this case, contact holes or vias through this layer, in order to bring the current to the lower electrode. Such vias make the fabrication more complicated and also run the risk of impairing the encapsulating function of the multilayer.

Document US 2004/0201346 discloses the use of DLC (a diamond-like carbon) amorphous carbon as cathode material, as an opaque monolayer electrode in the lower or upper position. In document JP 2003-109774, both electrodes are made of amorphous carbon.

In a completely different field to organic light-emitting diodes, the document entitled "*Multilayer systems based on a-Si:C:H films as dielectric and conducting optical mirrors and filters*" by N. A. Feoktistov and L. E. Morozova, published in Technical Physics Letters, Vol. 20, No. 3, Jan. 3, 1994, pp. 180-181, describes a mirror multilayer that is conducting and transparent, based on an alternation of sublayers having different refractive indices, as in document WO 03/052842. However, here the material of these sublayers is electrically conducting, being based on a mixture of carbon and amorphous silicon, which may be doped, especially with phosphorus. Here, the refractive index is varied between the adjacent sublayers by varying the amount of silicon in the material, making it possible to achieve large index differences between the sublayers, for example from a minimum of 2.1 to a maximum of 4.2, when the sublayers are not doped (see page 180, column 2, §2). Said document indicates that the doping of these sublayers, especially with phosphorus, allows the ratio of the parallel electrical resistance (parallel to the plane of the multilayer) to the perpendicular electrical resistance (perpendicular to the plane of the multilayer) to be adjusted.

According to said publication, this conducting multimirror layer is produced by the decomposition, under radiofrequency radiation, of methane/silane mixtures. This publication teaches that indices as different as possible between the adjacent sublayers are needed in order to optimize the optical characteristics. To obtain adjacent sublayers having such index differences, the above publication teaches that the silane content in the deposition chamber is made to vary: for example, 0% in the case of the high-index sublayers and up to about 80%, for example, in the case of the low-index sublayers.

However, the use of silane, especially at high levels, mixed with methane, involves serious hazards. Thus, the conducting mirror multilayer described in that publication has a major drawback.

In the field of organic light-emitting diodes, document U.S. Pat. No. 6,756,732 discloses a conducting mirror multilayer serving as upper electrode, based on conducting polymer materials, the conductivity and the encapsulating properties of which remain limited compared with those of amorphous carbon.

SUMMARY OF THE INVENTION

It is an object of the invention to simultaneously avoid the aforementioned drawbacks.

For this purpose, the subject of the invention is a light-emitting diode comprising a substrate, a lower electrode on the substrate, an upper electrode, an organic electroluminescent layer, which is interposed between these two electrodes and is capable of emitting radiation through at least one of said electrodes when a current is injected thereto by these electrodes, and at least one multilayer formed by the stack of a number $N \geq 1$ of series of two adjacent sublayers, the two sublayers of each series having different refractive indices $n_1$, $n_2$, wherein:
  at least one of said electrodes is formed from among at least one multilayer; and
  the material of said sublayers of each multilayer forming an electrode is amorphous carbon, the silicon content of which is less than 0.1% by weight.

Each multilayer forming an electrode is therefore made of amorphous carbon, having no silicon other than that contained in the inevitable impurities, and is sufficiently conducting to act as electrode. If this multilayer electrode according to the invention is a cathode, the amorphous carbon will preferably be n-doped, for example using nitrogen. If this multilayer electrode according to the invention is an anode, the amorphous carbon will preferably be p-doped, for example using phosphorus. The doping level is matched to the desired level of conductivity.

The invention covers a multitude of embodiments, among which:
- the lower electrode is an amorphous carbon multilayer and the upper electrode is a conventional electrode;
- the upper electrode is an amorphous carbon multilayer and the lower electrode is a conventional electrode; and
- both electrodes are amorphous carbon multilayers, one of which is at least transparent or semi-transparent.

Preferably, the diode according to the invention comprises only a single multilayer forming one of said electrodes and in that the other of said electrodes is reflecting or semi-reflecting with respect to said radiation.

Preferably, the refractive index difference $|n_1-n_2|$ of two adjacent sublayers of any one series is 0.5 or greater.

Instead of obtaining the refractive index difference between adjacent sublayers by varying the amount of silane in the deposition chamber, this index is variation is preferably obtained by suitably varying the deposition conditions. The article published by C. Godet in Journal of Applied Physics (JAP), Vol. 91, No. 7, p. 4154 illustrates this point.

Thanks to the invention, the use of silane is avoided, thereby allowing these diodes to be fabricated more safely.

Preferably, if $\lambda_0$ is the wavelength corresponding to the maximum intensity of the radiation emitted by the diode, for each of the series of two sublayers, if $d_1$ is the thickness of the sublayer of index $n_1$ and $d_2$ is the thickness of the sublayer of index $n_2$, then $n_1 d_1 = n_2 d_2 = \lambda_0/4$, approximately. The multilayer therefore provides a multimirror effect, as already described in the prior art, especially an effect of the DBR (Diffracting Bragg Reflector) type.

Preferably, the number N of series of two sublayers of different indices is greater than 4. The multimirror effect provided by the multilayer electrode according to the invention can thus be more easily optimized.

The reflecting character of one of the electrodes, conferred by the specific multilayer structure of this electrode, and the reflecting character of the other electrode create an optical cavity between the electrodes, which advantageously increases the level of extraction of the radiation emitted by the electroluminescent layer. The thickness of the organic layer is preferably adapted in a manner known per se in order to optimize the level of extraction.

Preferably, one said multilayer electrode is the lower electrode. The multilayer electrode then provides a lower encapsulating function, that is to say a function of a diffusion barrier for elements present in the substrate, which elements would run the risk of impairing the organic material of the electroluminescent layer.

The subject of the invention is also an illuminating or image-display panel comprising an array of diodes according to the invention.

BRIEF DESCRIPTION OF THE DRAWING

The invention will be more clearly understood on reading the description that follows, given by way of non-limiting example and with reference to FIG. 1, which illustrates, in cross section, a diode according to one embodiment of the invention.

DESCRIPTION OF THE PREFERRED EMBODIMENT

Figure 1:
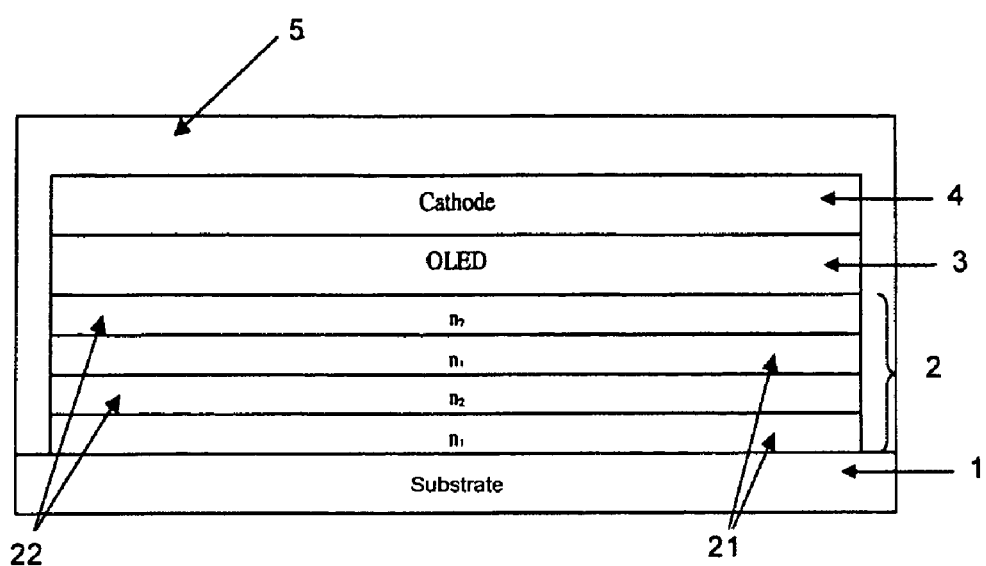

One exemplary embodiment of a diode panel according to the invention, here with a passive matrix, in which the diodes are interposed between an array of lower electrodes and an array of upper electrodes, will now be described.

A deposition mask, having apertures corresponding to the array of lower electrodes to be deposited, is applied to a substrate 1 made of transparent glass. The amorphous carbon multilayer 2 according to the invention is then deposited, through this mask, using a conventional vapor deposition technique, here based on methane and with no silane, under radiofrequency radiation (called PECVD). During deposition of amorphous carbon, the power of the radiofrequency radiation is varied, namely by alternating no radiofrequency power (i.e. CVD deposition), in order to obtain an amorphous carbon sublayer 21 of index $n_1=1.7$, with 100 W power (PECVD deposition) in order to obtain a sublayer 22 of index $n_2=2.35$. This alternation is repeated as many times as the multilayer contains a series of these sublayers 21, 22. For further details, the reader may refer to the abovementioned article by C. Godet in Journal of Applied Physics (JAP), Vol. 91, No. 7, p. 4154. The duration of each deposition phase, namely the CVD phase and the PECVD phase, is adapted in a manner known per se to the desired thickness of the sublayers, so that, if $\lambda_0$ is the wavelength corresponding to the maximum intensity of the radiation of the diodes and if $d_1$ is the thickness of the sublayers of index $n_1$ and $d_2$ is the thickness of the sublayers of index $n_2$, the following approximate equation is obtained: $n_1 d_1 = n_2 d_2 = \lambda_0/4$.

Next, an organic electroluminescent layer 3 is deposited in a manner known per se, said layer generally comprising a stack of several sublayers, namely an electroluminescent sublayer proper, interspersed between two charge injection/transport sublayers, namely for electrons on the cathode side and holes on the anode side. These injection/transport sublayers may be made of an organic material or polymer, whether doped or not, and semiconducting or conducting. These materials are known per se and will not be described here in detail. It is also possible to add, between each injection/transport sublayer and the electroluminescent sublayer, a sublayer for blocking carriers, namely holes on the cathode side and electrons on the anode side. Next, an array of upper electrodes 4, placed here perpendicular to the lower electrodes, is deposited in a manner known per se. Other configurations of the two arrays of electrodes may be envisaged without departing from the invention. The upper electrodes may be made of metal or a conducting oxide, such as for example a mixed indium tin oxide (ITO). These electrodes are reflecting or semi-reflecting. Preferably, the lower electrodes produced in the multilayer 2 are anodes and the upper electrodes are cathodes.

An encapsulating layer 5, made of insulating material, for example silica or silicon nitride, is then deposited.

A panel comprising an array of diodes according to the invention is obtained. Each diode of this panel corresponds to the area of overlap between a lower electrode and an upper electrode.

The multilayer 2 interposed between the substrate 1 and the organic layer 3 therefore has three functions:
- a lower electrode function, thanks to the high conductivity of amorphous carbon, which may furthermore be adapted and improved by doping;
- a Bragg mirror function, thanks to the index difference between the sublayers and to their thicknesses; and
- an encapsulation function, that is to say a diffusion barrier function, here diffusion between the substrate 1 and the organic layer 3.

Advantageously, the use of silane for depositing the multilayer 2 is avoided.

The amorphous carbon multilayer 2 according to the invention, containing no silicon other than that contained in the inevitable impurities, is generally sufficiently conducting to act as an electrode. However, it is possible to improve its conductivity by doping, for example by doping with nitrogen. For this purpose, nitrogen is introduced into the deposition chamber, together with the methane used as amorphous carbon precursor.

The present invention has been described with reference to an active-matrix organic light-emitting panel in which the multilayer serves as lower electrode. It is obvious to a person skilled in the art that the invention can be applied to diodes or panels in which the multilayer serves as upper electrode, or to diodes or active-matrix panels, without departing from the scope of the following claims.

The invention claimed is:

1. A light-emitting diode comprising a substrate, a lower electrode on the substrate, an upper electrode, an organic electroluminescent layer, which is interposed between these two electrodes and is capable of emitting radiation through at least one of said two electrodes when a current is injected thereto by these two electrodes, wherein at least one of said two electrodes is formed of a number N>1 of sublayers, each of the sublayers being made of amorphous carbon, each of the sublayers having different refractive indices $n_1$ or $n_2$, said amorphous carbon of each sublayer being electrically conductive and a silicon content of said amorphous carbon of each sublayer being less than 0.1% by weight.

2. The diode according to claim 1, wherein one of said two electrodes is formed of said sublayers and wherein the other of said two electrodes is reflecting or semi-reflecting with respect to said radiation.

3. The diode according to claim 1, wherein a refractive index difference $|n_1-n_2|$ between each of said sublayers is 0.5 or greater.

4. The diode according to claim 3, wherein, if $\lambda_0$ is a wavelength corresponding to a maximum intensity of said radiation, and, if $d_1$ is a thickness of the sublayer of index $n_1$ and $d_2$ is a thickness of the sublayer of index $n_2$, then $n_1 d_1 = n_2 d_2 = \lambda_0/4$, approximately.

5. An illuminating or image-display panel, comprising at least one light-emitting diode according to claim 1.

* * * * *